United States Patent [19]

Monnet et al.

[11] Patent Number: 5,329,226
[45] Date of Patent: Jul. 12, 1994

[54] PROBE CARD FOR TESTING INTEGRATED CIRCUIT CHIPS

[75] Inventors: René Monnet, Seyssinet-Pariset; Maurice Perrin, Saint Etienne de Crossey, both of France

[73] Assignee: SGS-Thomson Microelectronics S.A., Gentilly, France

[21] Appl. No.: 895,890

[22] Filed: Jun. 10, 1992

[30] Foreign Application Priority Data

Jun. 11, 1991 [FR] France ................................ 91 07477

[51] Int. Cl.$^5$ ..................... G01R 31/02; G01R 1/073; H05K 7/16
[52] U.S. Cl. ................ 324/158.1; 324/761; 361/754; 439/160
[58] Field of Search ............... 324/158 F, 158 P, 72.5; 439/152, 153, 115, 157, 159, 160; 361/752, 754

[56] References Cited

U.S. PATENT DOCUMENTS

| | | | |
|---|---|---|---|
| 2,984,811 | 5/1961 | Hennessey, Jr. et al. | 439/153 |
| 3,363,179 | 1/1968 | McCutcheon | 324/158 F |
| 4,862,077 | 8/1989 | Horel et al. | 324/158 F |
| 4,899,106 | 2/1990 | Ogura | 324/158 F |
| 4,923,404 | 5/1990 | Redmond et al. | 439/264 |
| 5,055,780 | 10/1991 | Takagi et al. | 324/158 F |

FOREIGN PATENT DOCUMENTS 1548376 12/1968 France ........................ 439/152

Primary Examiner—Ernest F. Karlsen
Attorney, Agent, or Firm—Lowe, Price, LeBlanc & Becker

[57] ABSTRACT

A ring maintains a circular daughtercard (32) plugged into a mothercard (30) and includes structure for removing the daughtercard from the mothercard. The ring includes: an inner vertical threading to be screwed on an external threading fixed to the mothercard (30), and a bottom portion having a cylindric recess for accommodating the daughtercard (32), the recess being coaxial to the threadings and having a depth substantially equal to the thickness of the daughtercard (32). The ring also includes at its bottom portion a plurality of vertical traversing rods (42) distributed about the recess, each having, at one end, an eccentric portion for releasing the daughtercard (44), and, at the other end, a roller for manipulating the rod and the eccentric portion. Each rod is manually operable by the roller to be brought to a first position, where its eccentric portion partially covers the recess while maintaining the daughtercard (32) without pressure in the recess, or to a second position where its eccentric portion does not maintain the daughtercard in the recess.

23 Claims, 2 Drawing Sheets

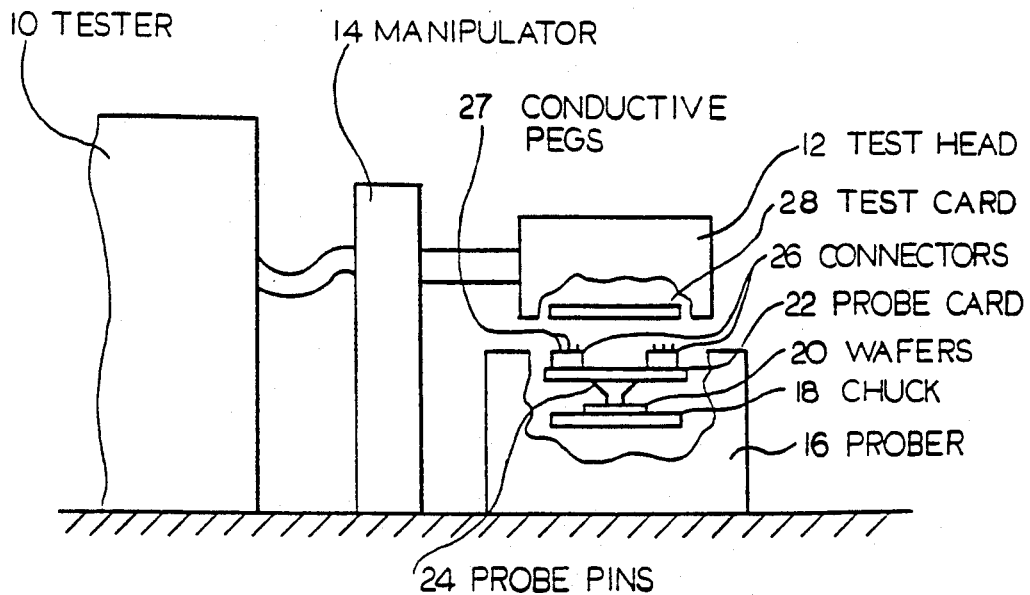
FIG. 1 - PRIOR ART
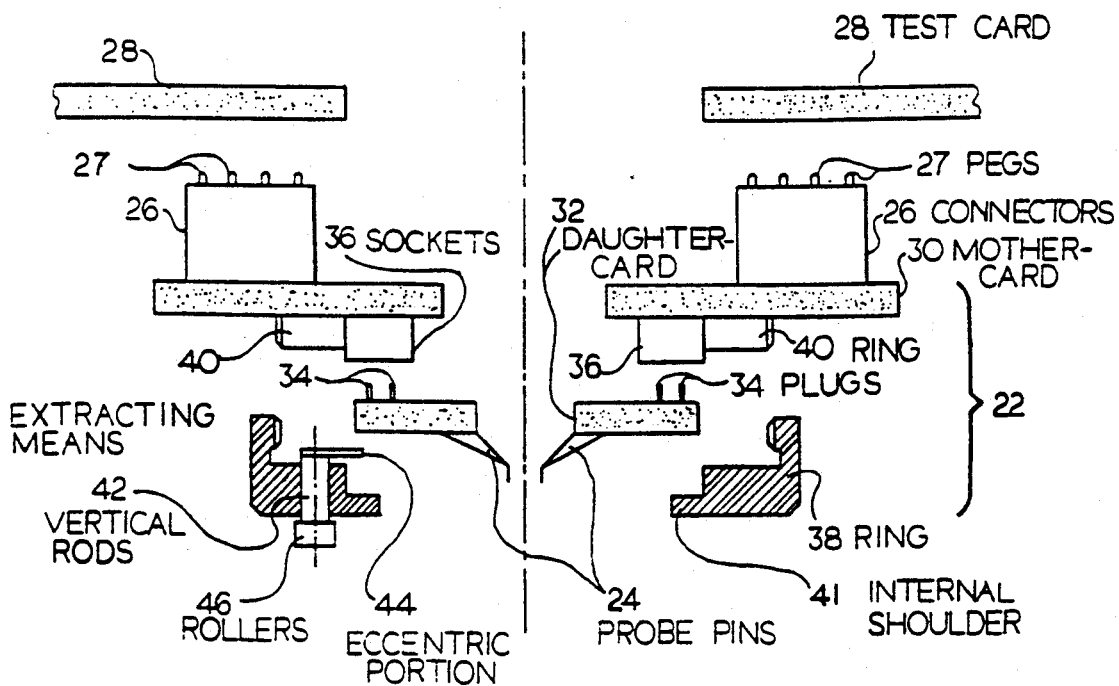
FIG. 2

PROBE CARD FOR TESTING INTEGRATED CIRCUIT CHIPS

BACKGROUND OF THE INVENTION

The present invention relates to testers for integrated circuit chips and particularly to the mounting of probe-cards of such a tester.

FIG. 1 shows a conventional installation for testing integrated circuit chips on wafers. This installation includes a tester which is capable of generating a plurality of test signals and measuring the responses of the tested chips to those signals. Tester is connected to a test head 12 held by a manipulator 14 and disposed above a wafer handling device 16, usually called a prober. Prober 16 comprises a wafer magazine (not shown) and a chuck 18 in which the wafers 20 to be tested are successively held. At the top of the prober and fixed to the frame thereof, a probe-card 22 is provided with downwardly extending probe-pins 24.

When a wafer 20 is being tested, the chuck 18 is moved so that the probe-pins 24 successively contact the pads of the chips on wafer 20. Thus, by bringing appropriate signals to some probe-pins 24 and by measuring voltages by means of other probe-pins 24 the operation of the chips can be checked.

At present, test signals can be of a very high frequency (about 300 Mhz). Accordingly, it is desired to reduce the length of the connections between the probe-pins 24 and test head 12 as much as possible in order to decrease the inductive effect of the connections. For this purpose, the probe-card 22 comprises connectors 26 including conductive pegs 27 connected to the probe-pins 24. The conductive pegs protrude from the top of the connectors and are mounted on springs. These pegs are intended to contact a test card 28 fixed at the bottom of the test head 12.

Such an installation has several drawbacks. Generally, it is necessary to provide a different probe-card 22 for each type of chip to be tested. Given the required positioning accuracy, it is difficult to mount and dismount the probe-cards. Moreover, for removing a probe-card, test head 12 has to be removed from prober 16. If the test head is removed too often, the conductive pegs 27 may be damaged and can no longer ensure satisfactory electrical contact.

It is thus an object of the invention to provide a probe-card that need not be entirely dismounted when the type of chip to be tested is changed.

Another object of the invention is to provide for simplified manipulation of probe-cards when the type of chip to be tested is changed.

SUMMARY OF THE INVENTION

These and other objects of the invention are achieved with a ring maintaining a circular daughtercard plugged into a mothercard, comprising: an inner vertical threading screwed on an external threading fixed to the mothercard; and a bottom comprising a cylindric recess in which is accommodated the daughtercard, coaxial to the threadings and having a depth substantially equal to the thickness of the daughtercard. The ring comprises in its bottom, around the recess, vertical traversing rods, each comprising at an end an eccentric portion. Each rod is manually operable to be brought to a first position where its eccentric portion partially covers the recess while maintaining the daughtercard without pressure in the recess, or to a second position where its eccentric portion does not maintain the daughtercard in the recess.

According to an embodiment of the invention, each eccentric portion is wedge-shaped, is substantially parallel to the bottom of the ring and has a low slope.

According to an embodiment of the invention, the bottom of the ring comprises keys against which the eccentric portions abut at each position of the rods.

According to an embodiment of the invention, the other ends of the rods are provided with rollers.

The invention relates more generally to a device for testing integrated circuit chips on a wafer, comprising: a prober provided at its top with a probe-card, the probe-pins of which contact the pads of a chip on said wafer, the probe-card comprising spring-mounted pegs protruding at the top of the prober; and a test head disposed above the prober and comprising at its bottom a test card contacting the spring-mounted pegs. The probe-card comprises a mothercard in which is plugged a daughtercard maintained with a ring as described above.

BRIEF DESCRIPTION OF THE DRAWINGS

The foregoing and other objects, features and advantages of the invention will be apparent from the following detailed description of preferred embodiments as illustrated in the accompanying figures wherein:

FIG. 1, above described, shows a conventional installation for testing integrated circuit chips on wafers;

FIG. 2 is a schematic and cross section view of an embodiment of a probe-card according to the invention;

DETAILED DESCRIPTION OF THE INVENTION

Figure 3:
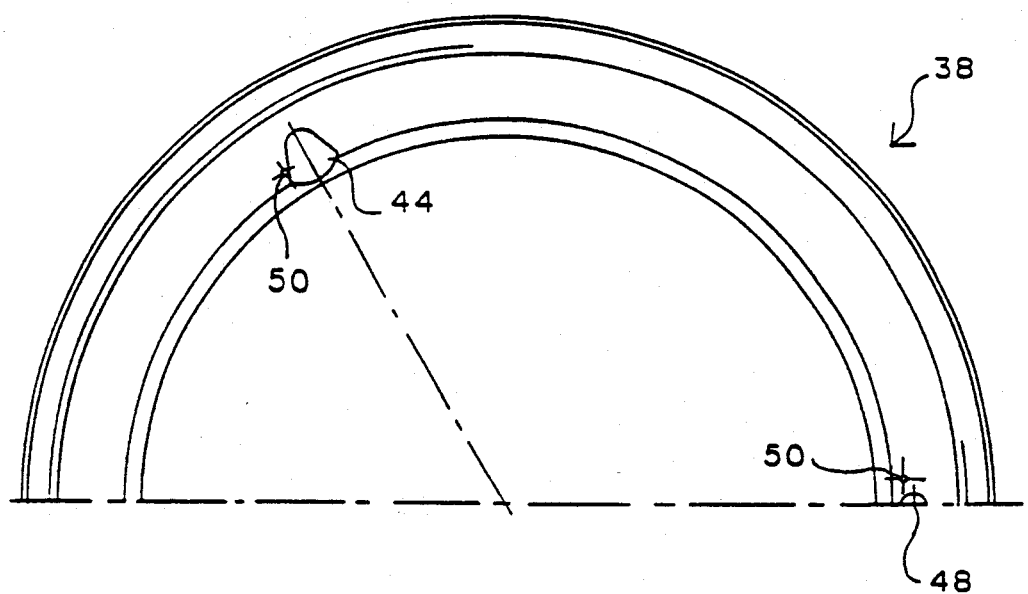
FIG. 3 is a partial view of an embodiment of a ring used in the probe-card of FIG. 2.

In FIG. 2 several elements of FIG. 1 are shown, the same elements being designated by the same reference numerals. The inventive probe-card 22 includes two parts, namely, a mothercard 30 and a daughtercard 32. The mothercard 30 is fixed to the frame of the prober and comprises the above described connectors 26. The daughtercard 32 is provided at its bottom with the probe-pins 24 and at its top with plugs 34 connected to probe-pins 24. The plugs 34 are plugged into sockets 36 mounted at the bottom of the mothercard 30.

The daughtercard 32 is held by a ring 38 which is screwed on an external threading of a ring 40 fixed to the bottom of the mothercard 30. The bottom of ring 38 is open to enable probe-pins 24 to pass therethrough and comprises a recess for accommodating the daughtercard. The daughtercard is circular and is held by an internal shoulder 41 of the ring 38 in contact with the bottom edges of the daughtercard.

However, to the extent described above, this system has a drawback as follows. In order to remove the daughtercard 32, it is necessary to unscrew the ring 38 and to manually extract the daughtercard 32 from its socket 36. This is relatively difficult when there is a large number of plugs 34. Thus, fingernails or a screwdriver must be inserted between the daughtercard 32 and the socket 36 to lift-off the daughtercard and to have a better grasp. In doing so, the daughtercard may be warped and the accurate positions of the probe-pins 24 may thus be damaged.

To avoid this drawback, according to the invention the ring 38 comprises, extracting means enabling separation of the daughtercard 32 from the mothercard 30 by unscrewing ring 38. Several vertical rods 42 are disposed around the recess accommodating the daughtercard 32. For example, three rods may be provided at 120° spacing, the rods passing through the ring. Each rod 42 comprises at its top an eccentric portion 44 that can be brought, by rotation of rod 42, into the gap between the daughtercard 32 and the socket 36. The rods 42 can be manipulated with rollers 46 fixed to their bottoms. The shoulder 41 and the eccentric portions 44 are arranged so that the daughtercard has some vertical clearance. Thus, the rotation of ring 38 is not impaired. To extract the daughtercard, rollers 46 are turned so as to bring the eccentric portions 44 into the gap between the daughtercard and socket 36 and ring 38 is normally unscrewed.

This system is so practical that it can be devised to leave test head 12 (FIG. 1) on prober 16 and to remove or mount the daughtercards from beneath the test head.

FIG. 3 is a top view of an embodiment of an extracting ring according to the invention. The figure shows an eccentric portion 44 positioned for extraction and, at 120° relative thereto, a hole 48 intended to receive a rod 42. The eccentric portion 44, as shown, has the shape of a disk-sector. .An extraction position of portion 44 is registered with a vertical key 50, for example, a partially embedded pin, against which one of the edges of the eccentric portion 44 abuts. In a free position of portion 44, that is, in a position enabling the card 32 to be separated from the ring 38, the other edge of the eccentric portion 44 abuts against key 50.

Figure 4:
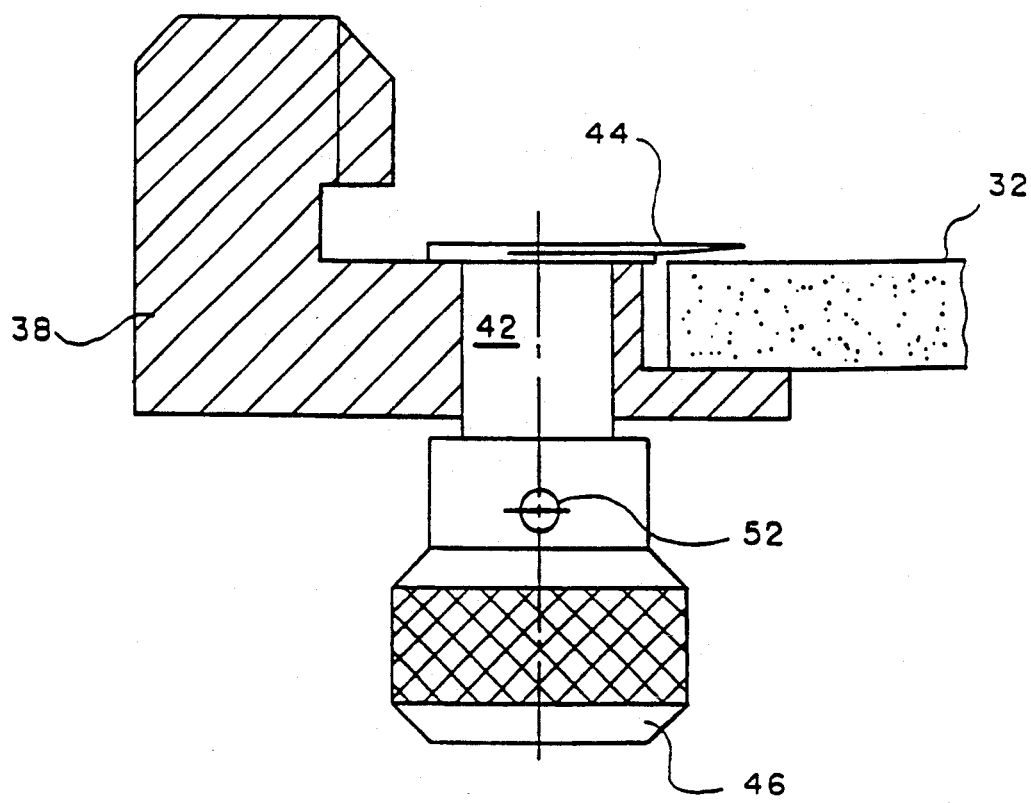
FIG. 4 is an enlarged and cross section view of an element of the ring of FIG. 3.

FIG. 4 shows an embodiment of an extracting device according to the invention in greater detail. Rod 42 and the eccentric portion 44 may be an integral unit, as shown in FIG. 4, wherein roller 46 is fixed to the bottom of rod 42 by means of a pin 52 engaging the roller 46 and the rod 42. Card 32 is shown disposed in the ring recess provided therefor. As shown in the Figure, the eccentric portion 44 is quite flat and while being relatively thin with respect to the card. The eccentric portion 44 is wedge-shaped in order to be easily inserted between card 32 and socket 36 when it is desired to start uncoupling card 32.

Various alternatives and modifications of the invention will appear to those skilled in the art. For example, it is possible to provide each rod 42 with a pulley and to interconnect the pulleys by means of a cable, which would enable simultaneous manipulation of all (or some) of the extraction devices by a single roller or the like. Moreover, although ring 38 has been described as having internal threads for engaging an externally threaded portion of mothercard 30, it should be appreciated that mothercard 30 may have an internally threaded portion depending therefrom and that ring 38 could have an externally threaded portion for engaging the mothercard.

Furthermore, the invention has been described for the specific case of inserting a daughtercard into a mothercard of a probe-card; but it applies to all cases where it is necessary to easily remove a card without warping.

We claim:

1. A maintaining ring for releasably maintaining a circular removable daughtercard (32) plugged into a base mothercard (30) of an integrated circuit probe card, comprising:

threaded means for engaging a mating threading fixed to said base mothercard (30);

a bottom portion including a cylindric recess for accommodating said removable daughtercard (32), said recess coaxial with the threaded means and having a depth substantially equal to a thickness of said removable daughtercard (32);

a plurality of vertical traversing rods (42) positioned adjacent said recess, each rod comprising an engaging means for engaging the daughtercard to release the daughtercard from the mothercard, and manipulating means for moving said engaging means between a first position, wherein said engaging means at least partially covers the recess thereby maintaining said daughtercard (32) in the recess, and a second position wherein said engaging means does not maintain said daughtercard in the recess.

2. A maintaining ring according to claim 1, wherein each said engaging means includes a wedge-shaped portion substantially parallel to the bottom portion of the ring.

3. A maintaining ring according to claim 1, wherein each said engaging means has a rotatable portion respectively eccentrically mounted on respective rods for rotating about respective axes of said rods between said first and second positions thereof.

4. A maintaining ring according to claim 3, wherein the bottom portion of said ring comprises a plurality of keys (50) forming stops for said eccentrically mounted rotatable portions to define said first and second positions thereof.

5. A maintaining ring according to claim 1, wherein each said engaging means is positioned at one end of a corresponding rod, each rod having a corresponding one of said manipulating means at an opposing end thereof.

6. A maintaining ring according to claim 5, wherein said manipulating means comprise respective roller members for each said rod.

7. A maintaining ring according to claim 1, wherein said
threaded means comprises an internally threaded annular member projecting from said daughtercard for engaging an externally threaded member projecting oppositely thereto from said mothercard.

8. An apparatus for testing integrated circuit chips on a wafer, comprising:
a prober (16) having an integrated circuit probe-card (22) at an upper surface thereof, said probe-card having a plurality of probe-pins for contacting corresponding pads of a chip on a wafer under test, said probe-card (22) comprising a plurality of pegs (27) protruding from the upper surface of said prober (16); and
a test head (12) disposed above said prober (16), and comprising at a bottom surface thereof a test card (28) contacting said pegs (27);
wherein the probe-card comprises a base mothercard (30) and a removable daughtercard, said daughtercard (32) plugged in said mothercard, said probe-card further comprising a maintaining ring (38) for releasably maintaining said daughtercard plugged into said mothercard,
said maintaining ring including a recess for accommodating said daughtercard and engaging means for engaging said daughtercard while releasing said daughtercard from the mothercard.

9. Apparatus according to claim 8, wherein said engaging means comprises a rotatable portion respectively eccentrically mounted on respective rods for rotating about respective axes of said rods a first position, wherein said engaging means at least partially covers the recess while maintaining said daughtercard (32) without pressure in the recess, and a second position wherein said engaging means does not maintain said daughtercard in the recess.

10. Apparatus according to claim 9, wherein said engaging means comprises a plurality of keys (50) forming stops for said eccentrically mounted rotatable portions to define said first and second positions thereof.

11. Apparatus according to claim 9, wherein said rotatable portions are respectively mounted on one end of a corresponding rod, each rod having a corresponding manipulating means on an opposing end thereof for moving said rotatable portions between said first and second positions thereof.

12. Apparatus according to claim 11, wherein said manipulating means comprises respective roller members for each said rod.

13. In an apparatus for testing integrated circuit chips on a wafer, the improvement comprising means for reducing a number of connections and withdrawals of conductive pegs from an integrated circuit probe-card to and from a test card, including:
   a base mothercard of said integrated circuit probe card connected by said conductive pegs to said test card;
   said mothercard including socket means;
   a removable daughtercard including plugs for plugging connecting to said socket means of said mothercard and probe pins for connecting to a wafer under test in said prober; and
   a maintaining ring including a recess for accommodating said daughtercard and engaging means for maintaining said daughtercard in said recess thereby releasing said daughtercard from the mothercard.

14. Apparatus according to claim 13, wherein said engaging means comprises a rotatable portion respectively eccentrically mounted on respective rods for rotating about respective axes of said rods between a first position, wherein sad rotatable portions at least partially covers the recess while maintaining said daughtercard (32) without pressure in the recess, and a second position wherein said rotatable portions do not maintain said daughtercard in the recess.

15. Apparatus according to claim 13, wherein said engaging means comprises a plurality of keys (50) forming stops for said eccentrically mounted rotatable portions to define said first and second positions thereof.

16. Apparatus according to claim 13, wherein said engaging means comprises rotatable portions each mounted on one end of a corresponding rod, each rod having a corresponding manipulating means on an opposing end thereof for moving said rotatable portions between a first position thereof, wherein sad rotatable portions at least partially cover the recess while maintaining said removable daughtercard in the recess, and a second position, wherein said rotatable portions do not maintain said removable daughtercard in the recess.

17. Apparatus according to claim 16, wherein said manipulating means comprises respective roller members for each said rod.

18. A method for releasing a removable daughtercard from a base mothercard of an interacted circuit probe card by manipulation of a maintaining ring, the maintaining ring including threaded means for engaging the base mothercard, a recess for accommodating the removable daughtercard and engaging means for engaging the removable daughtercard while releasing the removable daughtercard from the base mothercard, the engaging means including a plurality of rotatable portions each respectively mounted on a respective rod for rotating about a respective axis of the rod between a first position, wherein the rotatable portion at least partially covers the recess while maintaining the removable daughtercard int eh recess, and a second position wherein the rotatable portion does not maintain the removable daughtercard in the recess, the engaging means further including a plurality of keys forming stops for the rotatable portions to define the first and second positions thereof, the rotatable portions being mounted on respective first ends of corresponding rods, each rod having a corresponding manipulating means on an opposing end thereof for moving the rotatable portions between the first and second positions thereof, comprising the steps of:
   moving the engaging means to said first position thereby partially covering the recess and the removable daughtercard therein, and
   rotating the maintaining ring for threadedly disengaging said maintaining ring from said removable daughtercard, thereby causing said engaging means to engage the removable daughtercard for retaining the removable daughtercard in said recess for unplugging the removable daughtercard from the base card.

19. A method according to claim 18 comprising the further step of coupling said removable daughtercard to said base card, including the steps of:
   aligning the removable daughtercard with the base mothercard for plugging engagement therewith,
   moving the engaging means to said second position, and
   rotating the maintained ring for threadedly engaging said removable daughtercard while retaining the removable daughtercard in said recess thereof.

20. A maintaining ring according to claim 1, wherein each of said base mothercard and sadi removable daughtercard comprises a printed circuit card.

21. Apparatus according to claim 8, wherein each of said base mothercard and said removable daughtercard comprises a printed circuit card.

22. Apparatus according to claim 13, wherein each of said base mothercard and said removable daughtercard comprises a printed circuit card.

23. A method according to claim 18, wherein each of said base mothercard and said removable daughtercard comprises a printed circuit card.

* * * * *